(12) United States Patent
Kim et al.

(10) Patent No.: US 10,560,515 B2
(45) Date of Patent: Feb. 11, 2020

(54) METHOD AND APPARATUS FOR TRANSMITTING AND RECEIVING INFORMATION BETWEEN SERVERS IN CONTENTS TRANSMISSION NETWORK SYSTEM

(71) Applicant: Samsung Electronics Co., Ltd., Suwon-si, Gyeonggi-do (KR)

(72) Inventors: Hanseok Kim, Seoul (KR); Dongjin Lee, Suwon-si (KR); Seongryong Kang, Seongnam-si (KR); Jonghyune Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 15/544,709

(22) PCT Filed: Jan. 18, 2016

(86) PCT No.: PCT/KR2016/000492
§ 371 (c)(1),
(2) Date: Jul. 19, 2017

(87) PCT Pub. No.: WO2016/129815
PCT Pub. Date: Aug. 18, 2016

(65) Prior Publication Data
US 2017/0374140 A1    Dec. 28, 2017

(30) Foreign Application Priority Data

Feb. 9, 2015   (KR) ........................ 10-2015-0019636

(51) Int. Cl.
*G06F 13/00*  (2006.01)
*H04L 29/08*  (2006.01)
*H04L 29/06*  (2006.01)

(52) U.S. Cl.
CPC .............. *H04L 67/10* (2013.01); *H04L 69/04* (2013.01); *H04L 67/2842* (2013.01)

(58) Field of Classification Search
CPC ......... H04L 29/08; H04L 67/10; H04L 69/04; H04L 67/2876; H04L 69/166;
(Continued)

(56) References Cited

U.S. PATENT DOCUMENTS 5,832,490 A * 11/1998 Riley ...................... H03M 7/30
6,959,300 B1 * 10/2005 Caldwell ................. H03M 7/30
(Continued)

FOREIGN PATENT DOCUMENTS

| CN | 102594921 A | 7/2012 |
| CN | 102904930 A | 1/2013 |
| CN | 103037009 A | 4/2013 |

OTHER PUBLICATIONS

Chinese Office Action dated Sep. 30, 2019, issued in Chinese Application No. 201680009541.8.

*Primary Examiner* — Kenneth R Coulter
(74) *Attorney, Agent, or Firm* — Jefferson IP Law, LLP

(57) ABSTRACT

The present invention relates to a method and an apparatus for transmitting and receiving information between servers in a contents transmission network system and, more particularly, to a method and an apparatus for transmitting and receiving information between a core node and an edge node belonging to a contents transmission network. To accomplish the objective mentioned above, a method for receiving, by a receiving server, information in a contents transmission network according to one embodiment of the present invention comprises the steps of: receiving first information from a transmission server; determining a transmission unit of the first information on the basis of the received first information; transmitting, to the transmission server, a second information transmission request including information on
(Continued)

the determined transmission unit; and receiving, from the transmission server, second information generated on the basis of the information on the transmission unit. According to an embodiment of the present invention, the method and the apparatus for transmitting and receiving information between servers in a contents transmission network system can generate compressed information on the basis of original information sought to be transmitted between servers, whereby it is possible to obtain an effect of improving optimal compression efficiency, transmission efficiency between servers, and performance regarding the delay time between both communication ends.

16 Claims, 12 Drawing Sheets

(58) Field of Classification Search
CPC . H04L 67/2842; H04L 67/1097; H04L 67/02; H04L 67/06; H03M 7/30
USPC ............... 709/203, 247, 232, 231, 234, 236
See application file for complete search history.

(56) References Cited

U.S. PATENT DOCUMENTS

| | | | |
|---|---|---|---|
| 7,653,689 B1 | 1/2010 | Champagne et al. | |
| 7,720,878 B2* | 5/2010 | Caldwell | H03M 7/30 |
| | | | 707/803 |
| 7,856,583 B1 | 12/2010 | Smith | |
| 8,068,512 B2* | 11/2011 | Nitta | G06F 3/061 |
| | | | 370/465 |
| 8,239,578 B2* | 8/2012 | Denoual | H04L 51/00 |
| | | | 348/441 |
| 8,386,630 B1 | 2/2013 | Atzmon | |
| 8,806,062 B1* | 8/2014 | Vertongen | H04L 29/08783 |
| | | | 709/247 |
| 9,330,105 B1* | 5/2016 | Duprey | G06F 16/1744 |
| 9,356,645 B2* | 5/2016 | Agrawal | H04B 1/66 |
| 2005/0192994 A1* | 9/2005 | Caldwell | H03M 7/30 |
| 2008/0133830 A1* | 6/2008 | Nitta | G06F 3/061 |
| | | | 711/113 |
| 2010/0077100 A1* | 3/2010 | Hsu | H04W 72/1221 |
| | | | 709/234 |
| 2011/0055312 A1 | 3/2011 | Purdy, Sr. | |
| 2011/0246616 A1 | 10/2011 | Ronca et al. | |
| 2011/0302242 A1 | 12/2011 | Kim et al. | |
| 2012/0005312 A1 | 1/2012 | McGowan et al. | |
| 2013/0250849 A1 | 9/2013 | Li et al. | |
| 2013/0290466 A1 | 10/2013 | Lee et al. | |
| 2013/0308699 A1 | 11/2013 | Musser, Jr. et al. | |
| 2014/0143444 A1* | 5/2014 | Agrawal | H04B 1/66 |
| | | | 709/247 |
| 2014/0280471 A1 | 9/2014 | Lavi et al. | |
| 2015/0271100 A1 | 9/2015 | Huang et al. | |
| 2016/0366241 A1* | 12/2016 | Agrawal | H04B 1/66 |
| 2017/0286411 A1* | 10/2017 | Ablamsky | G06F 16/13 |

* cited by examiner

FIG. 4

| RULESET 1 | 2 KB | 2 KB | 4 KB | 4 KB | 4 KB | 8 KB | 8 KB |
| RULESET 2 | 2 KB | 2 KB | 4 KB | 4 KB | 8 KB | 12 KB |
| RULESET 3 | 2 KB | 2 KB | 4 KB | 16 KB | 8 KB |
| RULESET 4 | 32 KB | 16 KB | 8 KB | 8 KB |

METHOD AND APPARATUS FOR TRANSMITTING AND RECEIVING INFORMATION BETWEEN SERVERS IN CONTENTS TRANSMISSION NETWORK SYSTEM

TECHNICAL FIELD

The present invention relates to a method and apparatus for sending and receiving information between servers in a content delivery network system and, more particularly, to a method and apparatus for sending and receiving information between a core node and edge node belonging to a content delivery network.

BACKGROUND ART

A content delivery network (CDN) service is a service for stably delivering a variety of types of content including moving images, such as movies and music video, to a user.

In general, the content delivery network service is implemented to previously store content in a plurality of cache servers distributed to a network, to select an optimum cache server of the plurality of cache servers, and to deliver requested content to the terminal of a user through the selected cache server. Such a content delivery network has been implemented to solve a data loss, a bottleneck phenomenon, a low transfer rate, or instability, such as disconnected data, in the Internet based on the Internet.

Meanwhile, recently, as a mobile terminal becomes high performance and high function as in a smartphone and a communication cost is lowered, the use of content through a mobile terminal suddenly increases. Accordingly, an attempt to graft a mobile network and the server of a content delivery network is being made.

DISCLOSURE OF INVENTION

Technical Problem

The present invention has been proposed to solve the above problems and, more particularly, is to proposes a method and apparatus for sending and receiving information between a core node and an edge node using a method of determining, by the edge node, a delivery unit of the original information based on the original information and sending a compression information transmission request including the delivery unit in generating and sending compression information about the original information if the original information is transmitted again from the core node to the edge node.

Solution to Problem

In order to achieve the object, a method for a reception server to receive information in a content delivery network according to an embodiment of the present invention includes the steps of receiving first information from a transmission server, determining a delivery unit of the first information based on the received first information, transmitting a second information transmission request including information about the determined delivery unit to the transmission server, and receiving second information generated based on the information about the delivery unit from the transmission server.

Furthermore, a method for a transmission server to transmit information in a content delivery network according to another embodiment of the present invention for achieving the object includes the steps of transmitting first information to a reception server, receiving a second information transmission request including information about a determined delivery unit of the first information from the reception server, and generating second information based on the information about the delivery unit and transmitting the second information to the reception server.

Furthermore, a reception server receiving information in a content delivery network according to another embodiment of the present invention for achieving the object includes a communication unit transmitting and receiving information to and from a transmission server, and a control unit controlling receiving first information from the transmission server, determining a delivery unit of the first information based on the received first information, transmitting a second information transmission request including information about the determined delivery unit to the transmission server, and receiving second information generated based on the information about the delivery unit from the transmission server.

Furthermore, a transmission server transmitting information in a content delivery network according to another embodiment of the present invention for achieving the object includes a communication unit transmitting and receiving information to and from a reception server, and a control unit controlling transmitting first information to the reception server, receiving a second information transmission request including information about a determined delivery unit of the first information from the reception server, generating second information based on the information about the delivery unit, and transmitting the second information to the reception server.

ADVANTAGEOUS EFFECTS OF INVENTION

In accordance with the embodiment of the present invention, the method and apparatus for sending and receiving information between servers in a content delivery network system can have advantages of optimum compression efficiency, transmission efficiency between the servers, and performance improvement effect for delay time between communication ends because compression information based on the original information to be transmitted between the servers can be generated.

BRIEF DESCRIPTION OF DRAWINGS

FIG. 4 is a diagram showing information about a delivery unit between the core node and the edge node according to an embodiment of the present invention.

MODE FOR THE INVENTION

Figure 1:
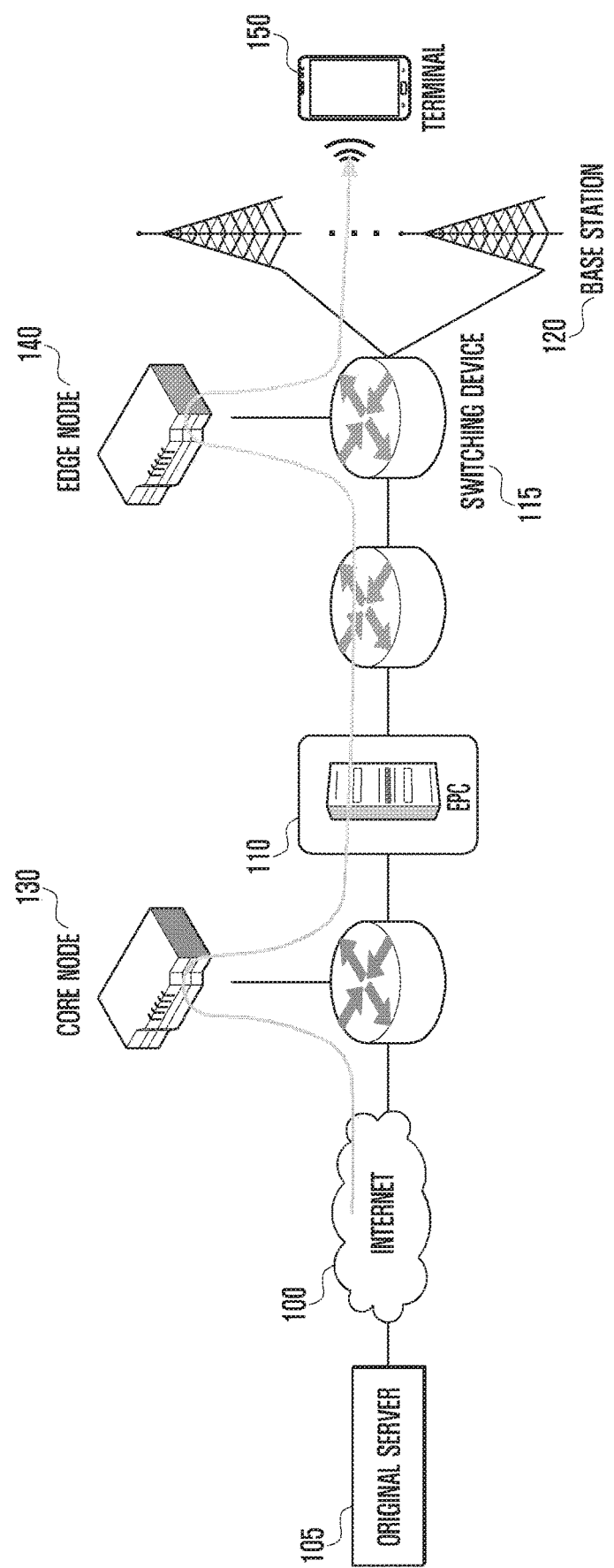
FIG. 1 is a diagram showing the configuration of a content delivery network system.

Hereinafter, embodiments of the present invention are described in detail with reference to the accompanying drawings.

In this specification, in describing the embodiments, a description of contents that are well known in the art to which the present invention pertains and not directly related to the present invention is omitted in order to make the gist of the present invention clearer.

For the same reason, in the accompanying drawings, some elements are enlarged, omitted, or depicted schematically. Furthermore, the size of each element does not accurately reflect its real size. In the drawings, the same or similar elements are assigned the same reference numerals.

The merits and characteristics of the present invention and a method for achieving the merits and characteristics will become more apparent from the embodiments described in detail in conjunction with the accompanying drawings. However, the present invention is not limited to the disclosed embodiments, but may be implemented in various different ways. The embodiments are provided to only complete the disclosure of the present invention and to allow those skilled in the art to understand the category of the present invention. The present invention is defined by the category of the claims. The same reference numerals will be used to refer to the same or similar elements throughout the drawings.

In the present invention, it will be understood that each block of the flowchart illustrations and combinations of the blocks in the flowchart illustrations can be executed by computer program instructions. These computer program instructions may be mounted on the processor of a general purpose computer, a special purpose computer, or other programmable data processing apparatus, so that the instructions executed by the processor of the computer or other programmable data processing apparatus create means for executing the functions specified in the flowchart block or blocks. These computer program instructions may also be stored in computer-usable or computer-readable memory that can direct a computer or other programmable data processing equipment to function in a particular manner, such that the instructions stored in the computer-usable or computer-readable memory produce an article of manufacture including instruction means that implement the function specified in the flowchart block or blocks. The computer program instructions may also be loaded into a computer or other programmable data processing apparatus to cause a series of operational steps to be performed on the computer or other programmable data processing apparatus to produce a computer-executed process, so that the instructions performing the computer or other programmable data processing apparatus provide steps for executing the functions described in the flowchart block or blocks.

Furthermore, each block of the flowchart illustrations may represent a portion of a module, a segment, or code, which includes one or more executable instructions for implementing a specified logical function(s). It should also be noted that in some alternative implementations, the functions noted in the blocks may occur out of order. For example, two blocks shown in succession may in fact be executed substantially concurrently, or the blocks may sometimes be executed in the reverse order, depending upon the functionality involved.

The term "unit", as used herein, means, but is not limited to, a software or hardware component, such as a field programmable gate array (FPGA) or an application-specific integrated circuit (ASIC), which performs specific tasks. The "unit" may advantageously be configured to reside on an addressable storage medium and configured to operate on one or more processors. Accordingly, the "unit" may include, for example, components, such as software components, object-oriented software components, class components, and task components, processes, functions, attributes, procedures, sub-routines, segments of program code, drivers, firmware, microcode, circuitry, data, databases, data structures, tables, arrays, and variables. The functionalities provided in the components and "units" may be combined into fewer components and "units" or may be further separated into additional components and "units." Furthermore, the components and "units" may be implemented to operation on one or more CPUs within a device or a security multimedia card.

FIG. 1 is a diagram showing the configuration of a content delivery network system.

More specifically, FIG. 1 is a diagram showing the configuration of a content delivery network system that belongs to mobile communication networks and that is configured based on long-term evolution (LTE) communication. Referring to FIG. 1, the content delivery network may include the Internet 100, an original server 105, an evolved packet core 110, a switching device 115, a base station 120, a core node 130, an edge node 140 and a terminal 150. The evolved packet core 110 and the switching device 115 may be collectively called a core network. The base station 120 and the terminal 150 may be collectively called a wireless access network. Furthermore, the core network and the wireless access network may be collectively called a mobile network.

The Internet 100 is a known communication network over which information is exchanged in accordance with the transmission control protocol/internet protocol (TCP/IP), and may be constructed using one or more of wired, wireless and optical communication technologies. The Internet 100 may provide various services, such as a social network service, an instant message service and the Internet portal service. Furthermore, the Internet 100 may be connected to the original server 105 of a content provider (CP) which serves content to a user. The Internet 100 connected to the original server 105 may provide information to the terminal 150, that is, a user, over the content delivery network.

The evolved packet core (EPC) 110 and the switching device 115 are collectively called a core network. The core network is a network system which performs major functions for mobile communication services. The core network may be implemented using various function elements. However, only the evolved packet core 110 and the switching device 115 necessary to describe a method of sending and receiving information according to the present invention are illustrated in FIG. 1. The evolved packet core 110 manages a flow of packets within the core network and the wireless access network and performs connection between the mobile network and the Internet 100.

The wireless access network including the base station 120 and the terminal 150 is an access network which performs wireless communication with the terminal 150 capable of accessing the mobile network, and may include a plurality of base stations 120.

The core node 130 and the edge node 140 are major elements which perform a method of sending and receiving information in a content delivery network according to an embodiment of the present invention. First, the core node 130 is connected to the Internet 100 and may send information if there is an information request from the mobile network. The core node 130 operates as a server that sends information. Accordingly, in the present invention, the core node 130 may be called a "transmission server." Hereinafter, the terms of the core node 130 and the transmission server are interchangeably used. When the core node 130 sends the information, it may process the information received from the original server 105 and send the processed information to the edge node 140.

The edge node 140 may store information, which has been processed and transmitted by the core node 130 and served by the original server 105, through various information storage methods. That is, the edge node 140 may be hereinafter called a "reception server" because it operates as a server that receives and stores information. Hereinafter, the terms of the edge node 140 and the reception server are interchangeably used. When there is an information request from the terminal 150, the edge node 140 may provide stored information to the terminal 150 instead of the original server 105.

A method of sending and receiving information between the core node 130 and the edge node 140 may include a process of processing the information. The method includes a process for the edge node 140 to reprocess received information again in a state prior to the state in which the information was processed by the core node 130 after the edge node 140 receives the information processed by the core node 130 when the edge node 140 sends the processed information to the terminal 150. The core node 130 splits information received from the original server 105 in a specific unit, compresses the information, and sends the compressed information to the edge node 140. A unit by which is split in order to process the information may be called the "delivery unit of the original information." The information delivery unit may include a chunk unit. Hereinafter, the "delivery unit of the original information" and the chunk unit may be interchangeably used. The edge node 140 reconstructs the received compressed information in the original chunk unit and sends the reconstructed information to the terminal 150. The chunk unit has been previously set between the core node 130 and the edge node 140.

Figure 2:
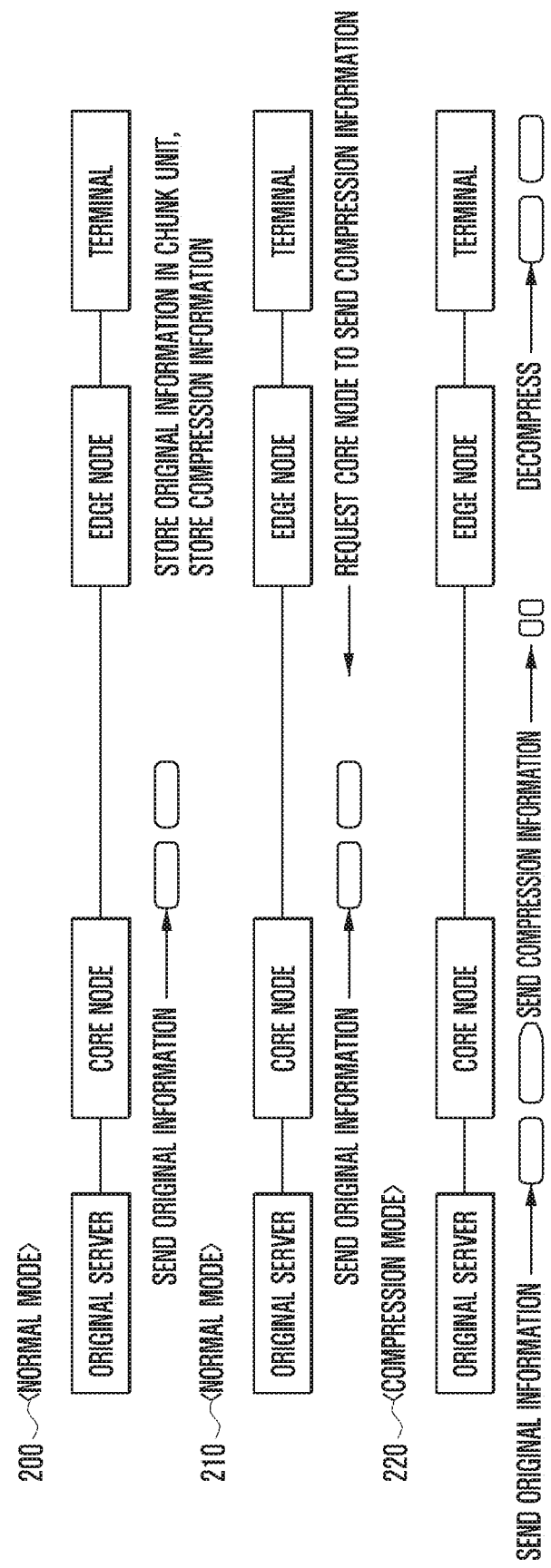
FIG. 2 is a diagram showing a process of sending and receiving information between the core node and edge node of a content delivery network.

FIG. 2 is a diagram showing a process of sending and receiving information between the core node and edge node of a content delivery network.

More specifically, FIG. 2 shows information delivery methods if the core node sends information to the edge node, in the case of the initial transmission 200 of information, and in the case of subsequent information transmission 210 and 220. Referring to FIG. 2, in the case of the initial transmission 200 of specific information in a normal mode, the core node may send the original information, received from the original server, to the edge node. The edge node that has received the original information splits the received original information in a preset chunk unit and generates compression information by compressing the split information. The edge node stores the original information split in the chunk unit and the compression information.

Thereafter, when the core node sends the transmitted information for the second time (210), it sends the original information as in the first case 200. After receiving the original information, the edge node splits the received information in a preset chunk unit and determines whether a specific number of chunk units or more are continuously identical with a stored chunk unit. If a specific number of the received chunk units or more are continuously identical with the stored chunk unit, the edge node requests the core node to send compression information.

Thereafter, when the core node receives the compression information request, it splits the original information, received from the original server, in a preset chunk unit in a compression mode, generates compression information by compressing the split information, and sends the compression information to the edge node. The edge node decompresses the received compression information and sends the decompressed information to the terminal.

Figure 3:
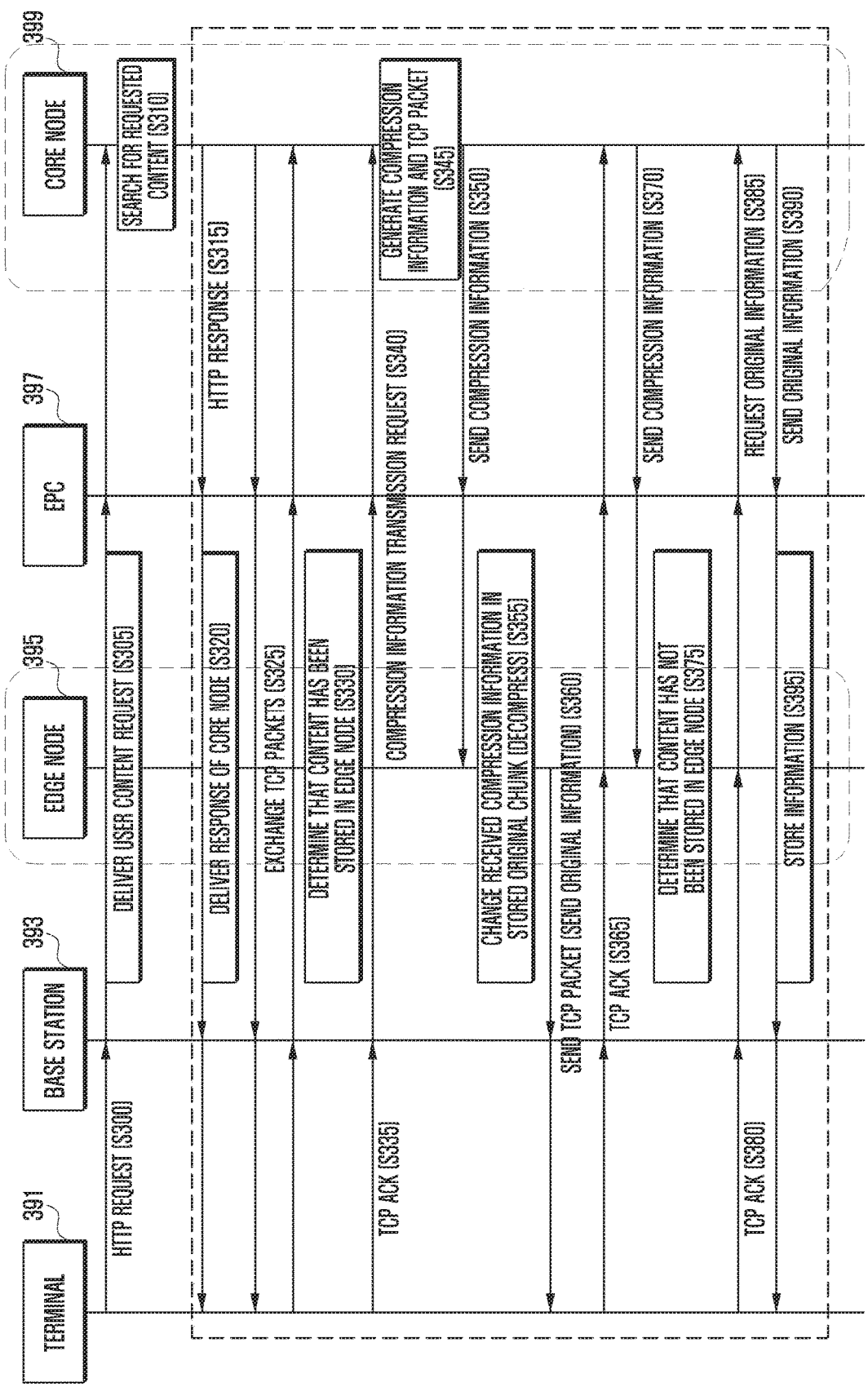
FIG. 3 is a diagram showing a process of sending and receiving information between nodes in a content delivery network.

FIG. 3 is a diagram showing a process of sending and receiving information between nodes in a content delivery network.

More specifically, FIG. 3 is a detailed diagram showing a procedure of initiating a change between the normal mode and the compression mode shown in FIG. 2 in the content delivery network. For convenience of description, a flowchart based on the hypertext transfer protocol (HTTP) has been shown in FIG. 3. At step S300, a terminal 391 requests the HTTP from a base station 393. At step S305, the base station 393 delivers a user content request to a core node 399 through an evolved packet core 397. At step S310, the core node 399 searches for the requested content. At this step, the core node 399 searches for the requested content and requests the requested content from the original server. At step S315, the core node 399 sends an HTTP response to the evolved packet core 397. At step S320, the evolved packet core 397 delivers the response of the core node 399 to the terminal through the base station 393. At step S325, the terminal 391, the base station 393, an edge node 395, the evolved packet core 397 and the core node 399 exchange transmission control protocol (TCP) packets.

Furthermore, at step S330, the edge node 395 determines whether information that has been requested by the terminal 391 and is to be transmitted by the core node 399 in response to the request is information already stored in the edge node 395. That is, at step S330, the edge node 395 generates compression information by collecting TCP packets, received at step S325, in a preset chunk unit, and determines whether the generated compression information is identical with compression information previously stored in the edge node 395. Alternatively, after receiving the original information, the edge node 395 splits the received information in a preset chunk unit and determines whether a specific number of chunk units or more are continuously identical with a stored chunk unit. The edge node 395 may determine whether a specific number the received chunk units or more are continuously identical with the stored chunk unit.

If the edge node 395 determines that the information received from the core node 399 is information already stored in the edge node 395 and receives TCP ACK from the terminal 391 at step S335, the edge node 395 may request the core node 399 to send the compression information at step S340. At step S345, the core node 399 generates compression information about the requested information and a TCP packet about the compression information. At step S350, the core node 399 sends the generated compression information to the edge node 395 through the evolved packet core 397. At step S355, the edge node 395 changes the received compression information to the stored original chunk. That is, the edge node 395 decompresses the compression information. At step S360, the edge node 395 sends the TCP packet to the terminal through the base station. At step S365, the terminal sends TCP ACK to the core node 399 via the base station 393, the edge node 395 and the evolved packet core 397. At step S370, the core node 399 sends the compression information to the edge node 395. If the edge node 395 determines that the original chunk corresponding to the received compression information has not been previously stored in the edge node 395 at step S375, when the edge node 395 receives TCP ACK from the terminal 391 through the base station 393 at step S380, it requests the original information from the core node at step S385. In response to the request for the original information, the core node 399 sends the original information to the terminal 391 through the edge node 395, the base station 393 at step S390. At step S395, the edge node 395 stores the received original information.

In the above process, the information exchanged between the core node 399 and the edge node 395 includes the original information and the compression information obtained by splitting the original information in a chunk unit of a specific size and compressing the split information of the chunk units in a specific size. In this case, the chunk unit has the same size regardless of the original information and has been previously set between the core node 399 and the edge node 395.

In this case, if the size of the chunk unit is too small, transmission efficiency between the core node and the edge node is low because a compression ratio is low. If the size of the chunk unit is too large, delay time between both ends which send and receive information may be increased because the time taken for the core node to receive packets of the chunk unit from the original server is increased. For example, there is a problem in that transmission efficiency is low because information is not received up to the chunk unit with respect to webpages having a small size and thus a compression mode is not applied to the information. Furthermore, in a system in which most of content is transmitted based on the TCP, if the size of the chunk unit is great, an increase of delay time in the start period of TCP transmission is more influenced. In this case, there is a need for an information transmission/reception method and apparatus for improving transmission efficiency of information and processing and re-processing performance of information.

FIG. 4 is a diagram showing information about a delivery unit between the core node and the edge node according to an embodiment of the present invention.

More specifically, FIG. 4 is a diagram showing the structure of a chunk unit, that is, a unit by which information is processed when the core node sends the information to the edge node. The core node receives information, requested by the terminal, from the original server. The information may include content and a packet. In the present invention, the content and the packet may be interchangeably used.

Furthermore, the core node sends the information, received from the original server, to the edge node and operates as a transmission server. In the present invention, the terms of the core node and the transmission server may be interchangeably used. Furthermore, the edge node receives processed information from the core node and operates as a reception server. In the present invention, the terms of the edge node and the reception server may be interchangeably used.

The core node may split a unit by which the information is transmitted in a chunk unit. In a conventional technology, the chunk unit has a static chunk structure. The static chunk structure means that the size of a fixed chunk unit continues to be used. That is, the chunk unit may have been previously determined and stored in the core node and the edge node. In this case, the core node splits information to be transmitted to the edge node in the size of the predetermined static chunk unit and generates compression information using the split information. The compression information may include a hash key, which may be expressed as a label. Hereinafter, the compression information, hash key and label may be interchangeably used.

In the case where the static chunk structure is used, however, if the size of a chunk unit is too smaller than the size of information, transmission efficiency between a code node and an edge node is low because a compression ratio is reduced. If the size of the chunk unit is too larger than the size of information, delay time between both ends which send and receive information may be increased because the time taken for the core node to receive packets of the chunk unit from the original server may be increased. For example, there is a problem in that transmission efficiency is reduced because information is not received up to the chunk unit with respect to webpages having a small size and thus a compression mode is not applied to the information. In particular, most of content is transmitted based on the TCP. If the size of a chunk unit is great, an increase of delay time in the start period of TCP transmission is more influenced. In order to describe such problems of a conventional technology, in the present invention, a dynamic chunk structure shown in FIG. 4 may be used.

In the dynamic chunk structure, the size of a chunk unit may be sequentially determined based on values defined in a previously stored ruleset. That is, not the size of a static chunk unit, but rulesets which may be set as the size of chunk units have been stored in the core node and the edge node. That is, pieces of the ruleset information may indicate candidates which may become the chunk unit. The determined ruleset may correspond to information about a delivery unit of the original information transmitted and received between the core node and the edge node.

The ruleset means the size of a chunk unit that is sequentially divided in a chunk unit. For example, in general, an IP packet and a chunk size have a KB unit. As shown in FIG. 4, if the size of the chunk unit is determined to be a ruleset 1 "2 KB, 2 KB, 4 KB, 4 KB, 8 KB, 8 KB", the core node splits information to be transmitted to the edge node in chunks "2 KB, 2 KB, 4 KB, 4 KB, 8 KB, 8 KB" and generates compression information with respect to each of the split chunk units. Furthermore, for example, the ruleset may be managed in {2, 2, 4, 4, 8, 8, . . . } by omitting a unit.

What the edge node determines one of some rulesets to be information about a delivery unit of the original information may be based on the type or characteristics of the information to be transmitted. If the core node first sends the original information to the edge node, the edge node selects a ruleset that belongs to the rulesets and that will be used to send the original information based on the original information and may determine the delivery unit of the original information. The determined ruleset corresponds to information about the delivery unit of the original information, and may be transmitted to the core node. Thereafter, the core node that has received the information about the delivery unit of the original information may generate compression information based on the information of the delivery unit and send the compression information to the edge node. This is described in more detail later with reference to FIGS. 5 to 8.

Figure 5A:
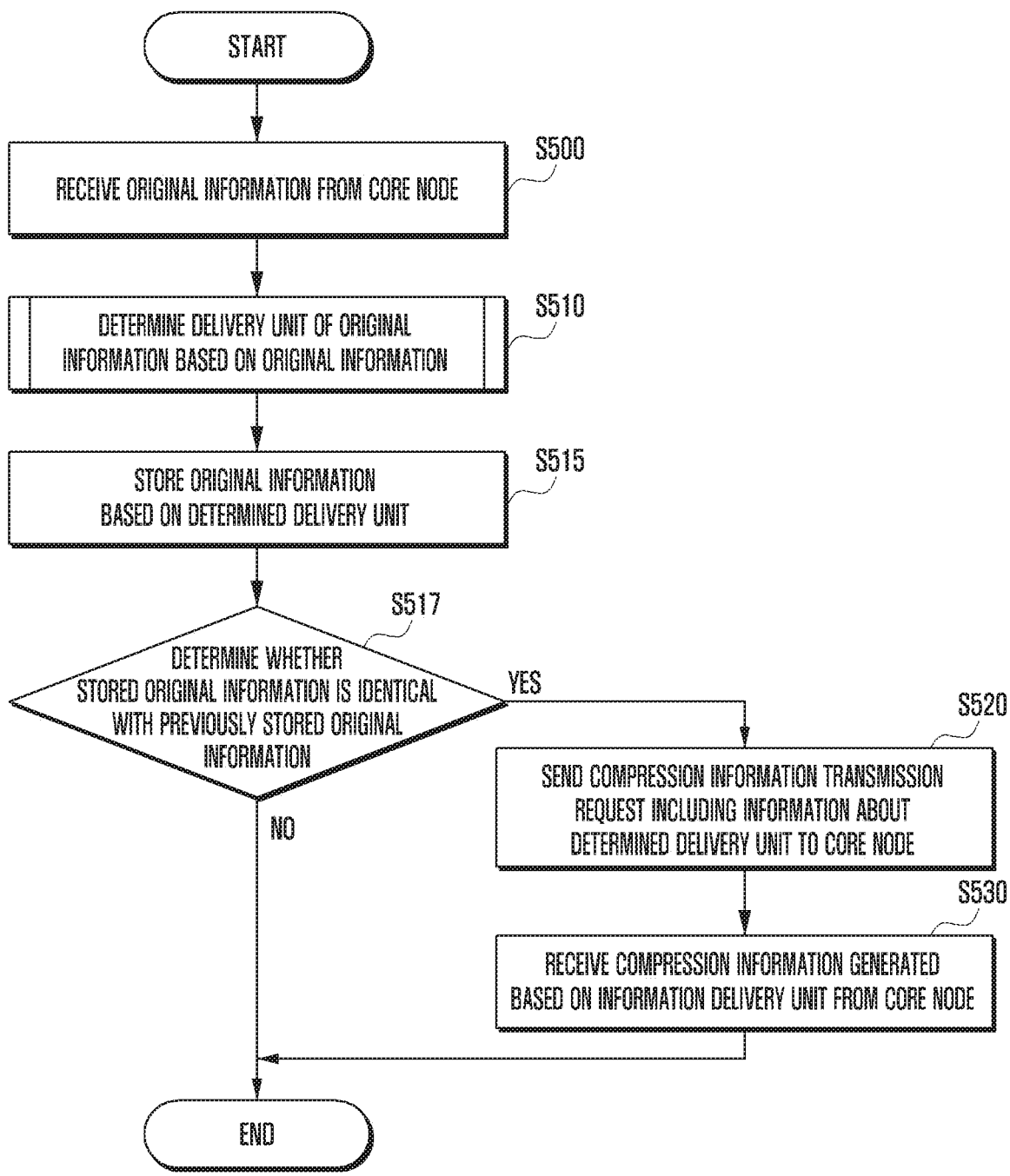
FIGS. 5A and 5B are flowcharts showing an operation for the edge node to receive information according to various embodiments of the present invention.

FIGS. 5A are flowcharts showing operations for the edge node to receive information according to various embodiments of the present invention.

Figure 5B:
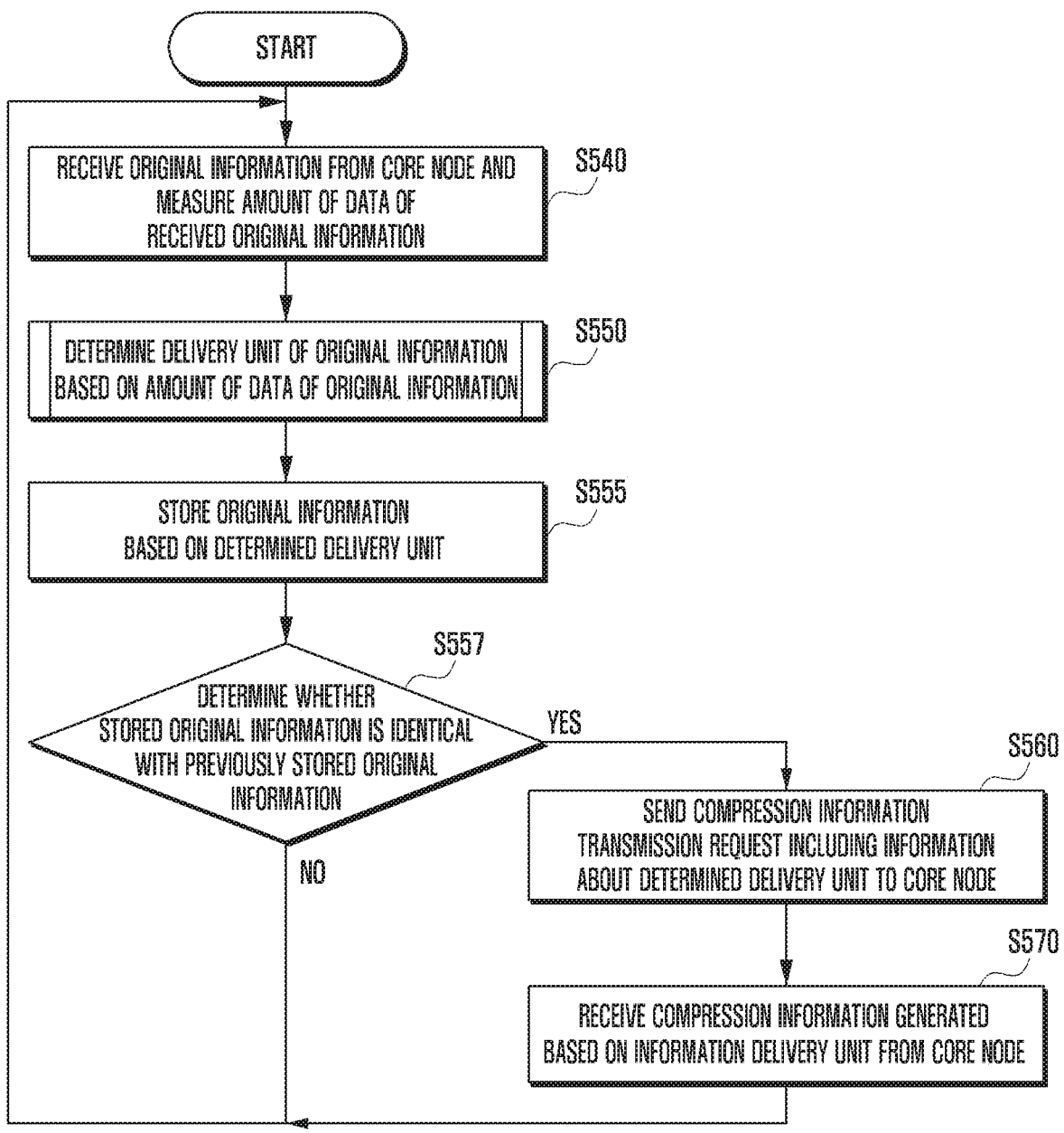

More specifically, FIG. 5A is a flowchart showing an operation for the edge node to receive information according to an embodiment of the present invention. FIG. 5B is a flowchart showing an operation for the edge node to receive information according to another embodiment of the present invention.

In FIG. 5A, the edge node may determine one ruleset to be information about a delivery unit of the original information based on the characteristics of the original information to be transmitted by the core node. At step S500, the edge node may receive the original information from the core node. When the core node receives a request for specific information from the terminal, it may send the original information for the specific information to the edge node. The edge node may receive the original information. At step S510, the edge node may determine a delivery unit of the original information based on the original information. The edge node may determine one of one or more rulesets previously stored in the core node and the edge node to be the delivery unit of the original information. To determine the delivery unit of the original information may include determining the size of a chunk unit to be used to send the original information. The edge node may determine one ruleset that belongs to the one or more rulesets and that will be used as the chunk unit depending on the type of the original information. This is described later with reference to FIG. 6.

At step S515, the edge node may store the original information based on information about the determined delivery unit. That is, the edge node may split the original information according to the determined ruleset and store the split information. At step S517, the edge node may determine whether the original information received at step S500 is identical with previously stored original information. To determine, by the edge node, whether the received original information is identical with the already received and stored original information may include splitting the received original information in the determined chunk unit and determining whether a specific number of chunk units or more are continuously identical with a chunk unit of the previously stored original information.

If the edge node determines that the original information received at step S500 is not identical with the previously stored original information at step S517, it does not perform an additional operation and terminates the operation of receiving the original information. If the edge node determines that the original information received and stored at step S500 is identical with the previously stored original information at step S517, it may send a compression information transmission request, including information about the determined delivery unit, to the core node at step S520. That is, if the original information received from the core node and stored at step S500 is identical with the previously stored original information, the edge node does not receive the original information again, but receives the compression information in order to reduce a load of information transmission. At step S530, the edge node may receive the compression information, generated based on the delivery unit, from the core node. Thereafter, the edge node may identify corresponding original information of pieces of the previously stored original information based on the received compression information, may convert the identified original information, and may send the converted original information to the wireless access network in order to send it to the terminal. A process after the edge node receives the compression information is the same as that described with reference to FIGS. 2 and 3.

In FIG. 5B, the edge node may determine one ruleset to be information about a delivery unit of the original information based on the cumulative amount of the original information received from the core node. The cumulative amount of the original information may correspond to the amount of data of information received from the core node. At step S540, the edge node may receive the original information from the core node and measure the cumulative amount of data of the received original information. When the core node receives a request for specific information from the terminal, the core node may send the requested original information to the edge node. The edge node may receive the original information.

At step S550, the edge node may determine a delivery unit of the original information based on the cumulative amount of data of the original information transmitted by the core node. The edge node may determine one of one or more rulesets previously stored in the core node and the edge node to be the delivery unit of the original information. To determine the delivery unit of the original information may include determining the size of a chunk unit that will be used to send the original information. The operation of the edge node is described later with reference to FIG. 7.

At step S555, the edge node may store the original information based on information about the determined delivery unit. That is, the edge node may split the original information according to the determined ruleset and store the split information. At step S557, the edge node may determine whether the original information received and stored at step S540 is identical with previously stored original information. To determine, by the edge node, whether the received original information is identical with the already received and stored original information may include determining whether a specific number of chunk units or more split in the chunk unit determined and stored at step S555 are continuously identical with a chunk unit of the stored original information.

If the edge node determines that the original information received at step S540 is not identical with the previously stored original information at step S557, it does not perform an additional operation and terminates the operation of receiving the original information. If the edge node determines that the original information received at step S540 is identical with the previously stored original information at step S557, it may send a compression information transmission request, including information about the determined delivery unit, to the core node at step S560. That is, if the original information received from the core node at step S540 is identical with the previously stored original information, the edge node does not receive the original information again, but receives the compression information in order to reduce a load of information transmission. At step S570, the edge node may receive the compression information, generated based on the delivery unit, from the core node. Thereafter, the edge node may identify corresponding original information of pieces of the previously stored original information based on the received compression information, may convert the identified original information, and may send the converted original information to the wireless access network in order to send it to the terminal.

A process after the edge node receives the compression information is the same as that described with reference to FIGS. 2 and 3.

Thereafter, the edge node returns to step S540, may receive the original information from the core node, and may measure the amount of data of the received original information. At step S550, the edge node may determine a delivery unit of the original information again based on the cumulative amount of data of the original information received by the edge node. If the determined delivery unit of the original information is different from a previously determined delivery unit of information, an operation of changing the previous delivery unit to the re-determined delivery unit of the information may be included. If the edge node receives the same original information as that received from the core node again, it requests the core node to send compression information based on the amount of data of the original information that is received in real time not uniformly generated compression information, thereby being capable of obtaining a data transmission efficiency improvement effect. That is, for example, when a TCP packet is to be transmitted, in the case of initial transmission, in order to prevent an increase of delay time in a TCP slow start section, the edge node may request the core node to generate compression information based on a ruleset having a relatively small chunk unit. Thereafter, if the number of transmission packets has been increased, it deviates from the slow start section as the amount of accumulated information increases. Accordingly, the edge node may request the core node to increase a compression ratio in generating compression information by increasing the chunk unit, thereby being capable of properly improving information transmission efficiency. Thereafter, an operation is the same as that described above.

An embodiment has been divided into the embodiments of FIGS. 5A and 5B and the methods for the edge node to receive information have been shown in FIGS. 5A and 5B. However, they correspond to embodiments for achieving the object of the present invention, and the methods of FIGS. 5A and 5B may be merged. That is, for example, the edge node may first determine a delivery unit based on the characteristics of the original information to be transmitted by the core node, may measure the amount of data of the received original information in real time, may update information about the delivery unit, that is, a ruleset, based on the measured amount of data, and may send a compression information transmission request, including the updated information about the delivery unit, to the core node. Furthermore, the aforementioned method may correspond to an embodiment for achieving the object of the present invention, and may further include a method which may be applied by a person having ordinary skill in the art.

Figure 6:
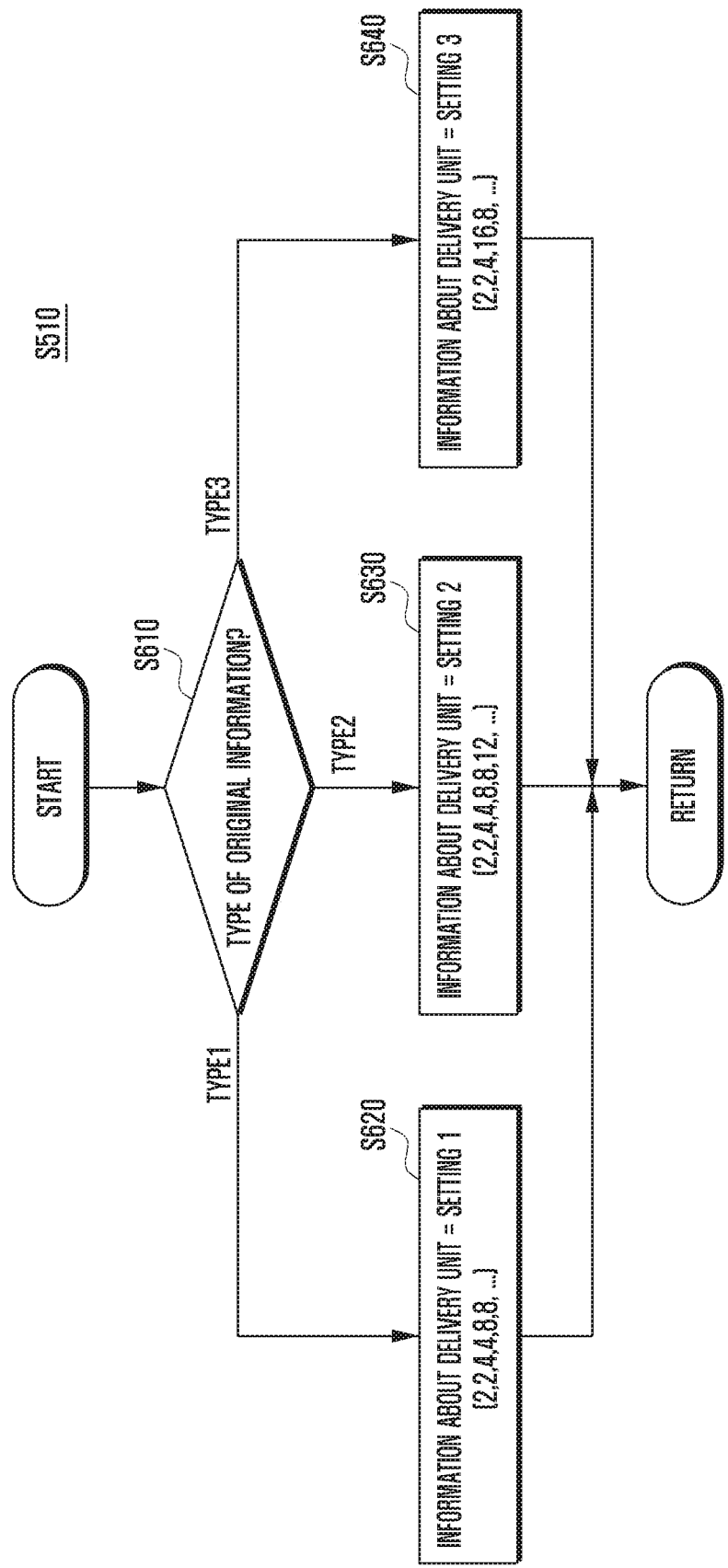
FIG. 6 is a diagram illustrating a detailed method of determining a delivery unit of the original information based on the original information according to an embodiment of the present invention.

FIG. 6 is a diagram illustrating a detailed method of determining a delivery unit of the original information based on the original information according to an embodiment of the present invention.

More specifically, at step S610, the edge node may determine the type of received original information. More specifically, the type of original information may be determined depending on the size of a file of a minimum unit that forms the original information. For example, the type of original information may be determined depending on whether the received original information is information about a webpage using the hypertext transfer protocol (HTTP), streaming information using the HTTP, or information using a file transfer protocol (FTP).

The edge node may proceed to steps S620, S630 and S640 based on a determination at step S610 and determine a ruleset. For example, in the case where the original information is information about a webpage using the HTTP, if the edge node proceeds to step S620 and determines a delivery unit of the original information to be "setting 1", the webpage has a relatively small data size. The ruleset may be determined to be a relatively small chunk unit, that is, {2, 2, 4, 4, 4, 8, 8, . . . }. That is, the reason for this is to prevent a problem in that in generating compression information by splitting a webpage having a small data size, in the case where the compression information is generated by splitting the webpage in a chunk unit of a fixed large size unlike in the above case, transmission efficiency is deteriorated because a compression mode is not applied to information corresponding to a previously determined chunk unit if the information is not received.

For another example, if the core node sends the original information, that is, streaming information using the HTTP, that is, if the core node sends information, such as a moving image, in general, moving image information has a large amount of data, but includes some data of a small size because the moving image information is transmitted in a streaming manner. Accordingly, the total data size of the moving image information is large, but the size of the data that forms the moving image information is small. Accordingly, a unit of information transmission may be determined to be "setting 2", that is, a ruleset having a chunk unit of a relatively small size.

For another example, if the core node sends the original information, that is, information using the FTP, the edge node may determine a delivery unit of the information to be "setting 3" having a relatively large chunk unit because the information has a relatively greater size than information using the HTTP. In addition, the method for the edge node to determine the type of information by sensing the received original information and the method for the edge node to determine a delivery unit of information based on the type of information may comply with a known deep packet inspection (DPI) operation and cache operation.

Figure 7:
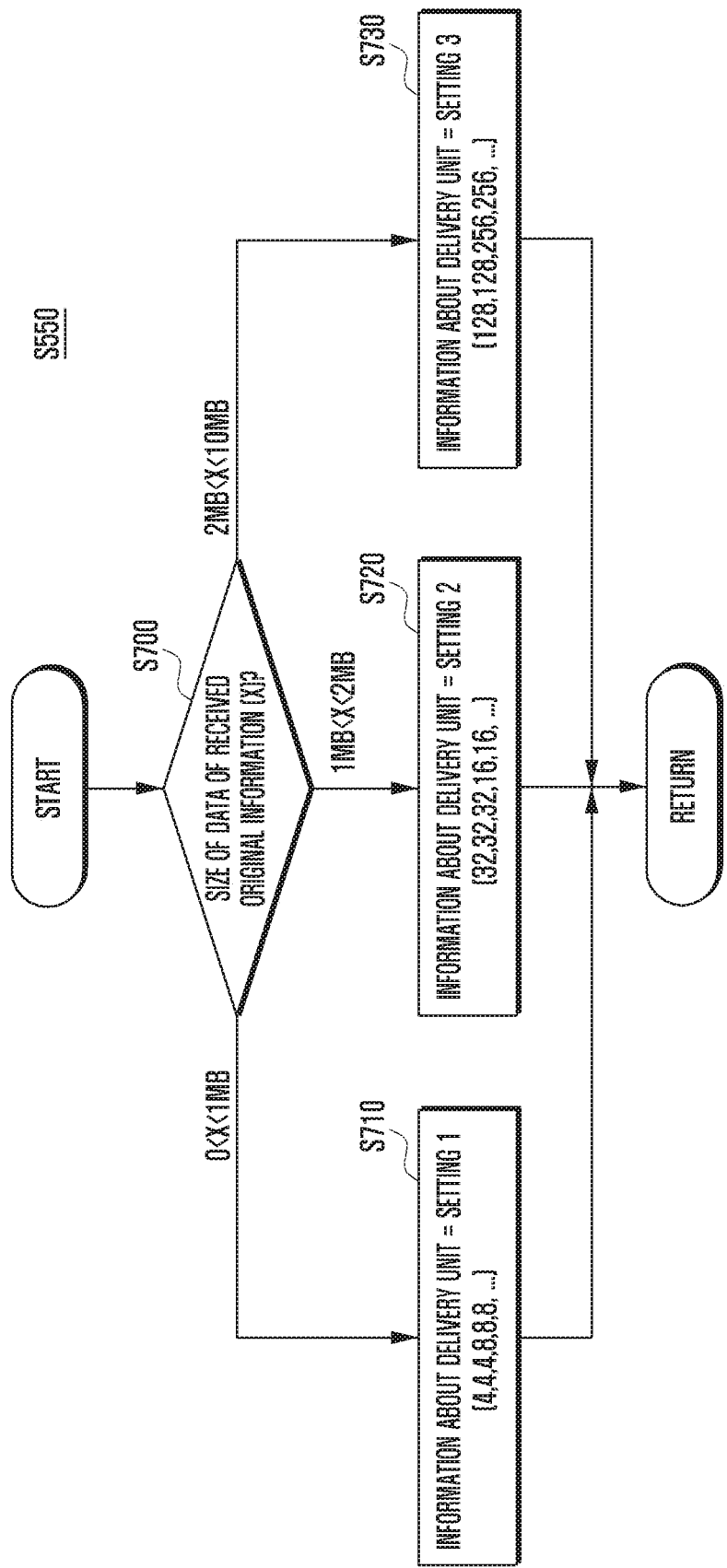
FIG. 7 is a diagram illustrating a detailed method of determining a delivery unit of the original information based on the amount of data of the original information according to another embodiment of the present invention.

FIG. 7 is a diagram illustrating a detailed method of determining a delivery unit of the original information based on the amount of data of the original information according to another embodiment of the present invention.

More specifically, at step S700, the edge node determines that the amount of accumulated data of the original information received at step S540 corresponds to which range. FIG. 7 shows an embodiment in which the edge node may operate. For example, assuming that the amount of data is X, the edge node may determine that x belongs to which one of 0<X<1 MB, 1 MB<X<2 MB and 2 MB<X<10 MB. The edge node may proceed to step S710, S720 or S730 based on the determined amount of accumulated data and determine a ruleset according to the setting 1, 2 or 3 to be a delivery unit.

That is, the edge node may determine a delivery unit of information based on the amount of data that is received and accumulated in real time, may update information about the delivery unit of the information in real time, and may send the updated information to the core node. If the amount of transmitted data exceeds a reference value or an elapse time exceeds a predetermined threshold, the edge node may update information about a delivery unit of information in order to enhance transmission efficiency.

In determining a proper ruleset based on the amount of the accumulated data, when a TCP packet is received, in the case of 0<x<1 MB that is initial transmission, the ruleset of the setting 1 having a relatively small chunk unit may be selected in order to prevent an increase of delay time in the TCP slow start section. Furthermore, the amount of accumulated information increases and exceeds the TCP slow start section, thus making the amount of the accumulated information become the range of 1 MB<x<2 MB or 2 MB<x<10 MB. Accordingly, a compression ratio may be increased by increasing the chunk unit, thereby properly enhancing information transmission efficiency. If the amount of the accumulated information deviates from the range, the ruleset may be determined to be the finally determined information delivery unit.

An example in which when a delivery unit of information is determined using a method, such as that of FIG. 7, the delivery unit of the information may be updated in real time and a request to send compression information including the updated delivery unit of information may be transmitted to the core node has been described at step S570 of FIG. 5B. If the real-time update method is used as described above, when the core node and the edge node share the same size of a chunk unit, that is, a delivery unit of information, using the method at step S570, the mismatch of a chunk unit attributable to a temporal difference or any error can be prevented. That is, the edge node may operate to include information about a delivery unit of information in a compression information transmission request message while sending the compression information transmission request message to the core node. If a delivery unit included in the compression information transmission request message and transmitted by the edge node is different from a delivery unit known to the core node, the core node has only to generate compression information by applying a delivery unit requested by the edge node in real time, that is, the size of a chunk unit, and to send the compression information. Accordingly, an error attributable to the mismatch of a delivery unit between the edge node and the core node can be prevented.

Figure 8A:
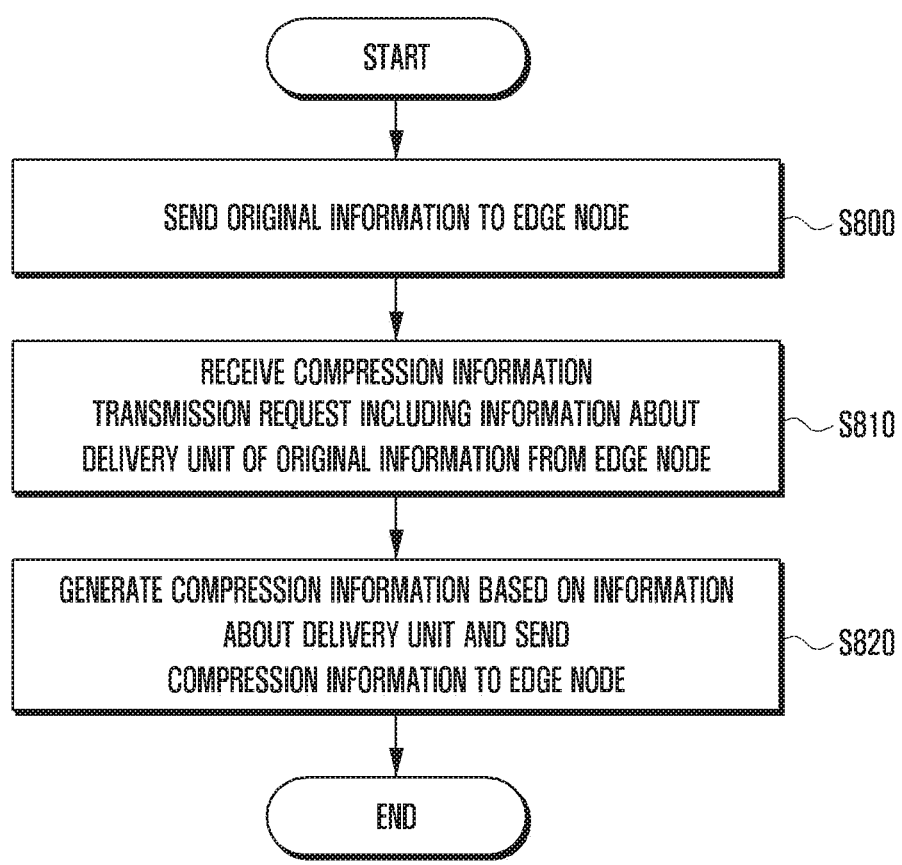
FIGS. 8A and 8B are diagrams showing operations for the core node to send information according to various embodiments of the present invention.
Figure 8B:
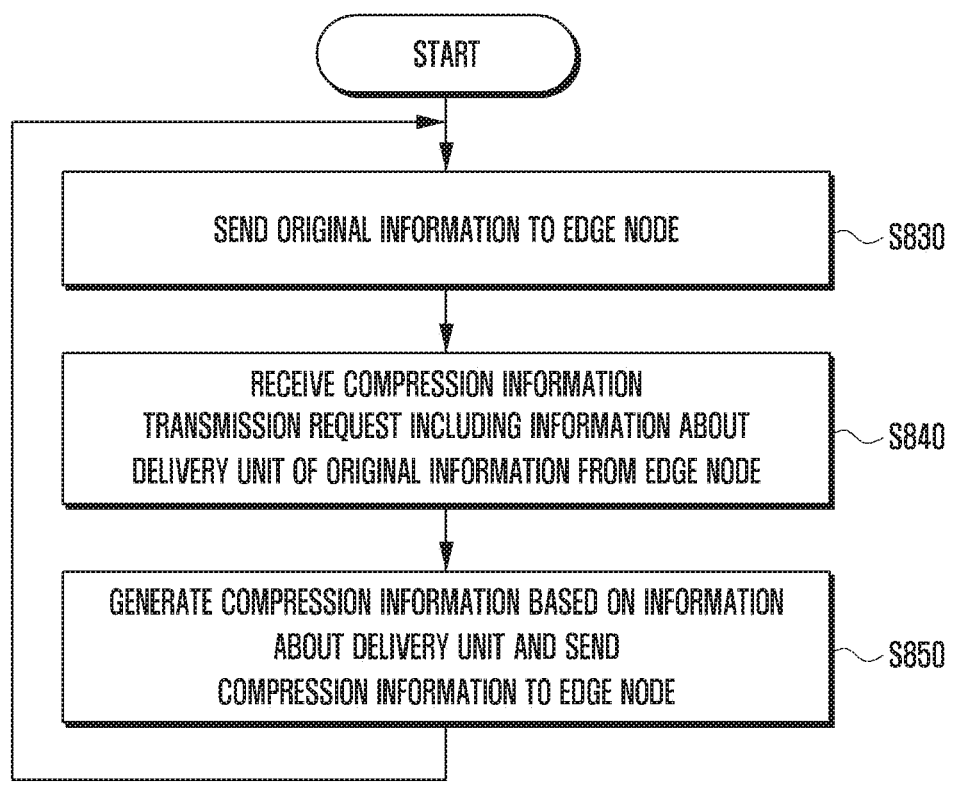

FIGS. 8A and 8B are diagrams showing operations for the core node to send information according to various embodiments of the present invention.

More specifically, FIG. 8A is a diagram showing a method for the core node to generate compression information by processing the original information and to send the compression information to the edge node according to an embodiment of the present invention. The method of FIG. 8A corresponds to the operation of the edge node in FIG. 5A.

At step S800, the core node may send the original information to the edge node. When a request for the transmission of specific information is received from a terminal in a network to which the core node belongs, the core node may send the original information to the edge node. The specific information may correspond to content. The core node may receive the requested content from the original server by requesting the requested content from the original server in the network to which the core node belongs.

At step S810, the core node may receive a compression information transmission request, including information about a delivery unit of the original information, from the edge node. An operation for the edge node to determine the delivery unit and to send the compression information transmission request including the information about the delivery unit is the same as that of FIG. 5A. That is, the edge node may determine one ruleset to be the information about the delivery unit of the original information based on the characteristics of the original information to be transmitted by the core node. The edge node may send the determined one ruleset, that is, the information about the delivery unit, to the edge node.

At step S820, the core node may generate compression information based on the information about the delivery unit which has been received from the edge node, and may send the compression information to the reception server. The information about the delivery unit received from the edge node may be used to split the original information so as to generate the compression information. That is, the information about the delivery unit corresponds to one of one or more rulesets previously determined between the core node and the edge node, and may include information about a chunk unit by which the original information is split. That is, when a compression information transmission request is received from the edge node, the core node may split the original information based on the information about the delivery unit. For example, if the information about the delivery unit, that is, a ruleset, is {2, 2, 4, 4, 8, 8, . . . }, the core node may split the original information in a chunk unit of "2 KB, 2 KB, 4 KB, 4 KB, 8 KB, 8 KB, . . . " The core node generates the compression information by compressing the original information, split in the chunk unit, according to a compression method. The compression method complies with a known cache operation, and it is not the range of right of the present invention and is not handled herein. The generated compression information may be called a hash key and may include a label. In the present invention, compression information, a hash key and a label may be interchangeably used. Furthermore, in general, the hash key or label indicates compression information, and may include another piece of information which may be used by a person having ordinary skill in the art in order to achieve the object of the present invention.

The core node may send the generated compression information to the edge node. That is, the core node may send the compression information, hash key or label to the edge node in response to the compression information transmission request received from the edge node. If the core node sends the same original information as the original information already transmitted to the edge node again using such a method, the core node sends compression information based on the characteristics of the original information not uniformly generated compression information, thereby being capable of obtaining optimum compression efficiency and performance improvement effects.

Meanwhile, FIG. 8B is a diagram showing a method for the core node to generate compression information by processing the original information and to send the compression information to the edge node according to another embodiment of the present invention. The method of FIG. 8B corresponds to the operation of the edge node in FIG. 5B.

At step S830, the core node may send the original information to the edge node. When a request for the transmission of specific information is received from a terminal in a network to which the core node belongs, the core node may send the original information to the edge node. The specific information may correspond to content. The core node may receive the requested content from the original server by requesting the requested content from the original server in the network to which the core node belongs.

At step S840, the core node may receive a compression information transmission request, including information about a delivery unit of the original information, from the edge node. An operation for the edge node to determine the delivery unit and to send the compression information transmission request including the information about the delivery unit is the same as that of FIG. 5B. That is, the edge node may determine one ruleset to be the information about the delivery unit of the original information based on the amount of accumulated data of the original information transmitted by the core node. The edge node may send the determined one ruleset, that is, the information about the delivery unit, to the core node.

At step S850, the core node may generate compression information based on the information about the delivery unit which has been received from the edge node, and may send the compression information to the edge node. The information about the delivery unit received from the edge node may be used to split the original information so as to generate the compression information. That is, the information about the delivery unit corresponds to one of one or more rulesets previously determined between the core node and the edge node, and may include information about the size of a chunk unit by which the original information is split. That is, when a compression information transmission request is received from the edge node, the core node may split the original information based on the information about the delivery unit. For example, if the information about the delivery unit, that is, a ruleset, is {2, 2, 4, 4, 8, 8, . . . }, the core node may split the original information in a chunk unit of "2 KB, 2 KB, 4 KB, 4 KB, 8 KB, 8 KB, . . . ". The core node generates the compression information by compressing the original information, split in the chunk unit, according to a compression method. The compression method complies with a known cache operation, and it is not the range of right of the present invention and is not handled herein.

The generated compression information may be called a hash key and may include a label. In the present invention, compression information, a hash key and a label may be interchangeably used. Furthermore, in general, the hash key or label indicates compression information, and may include another piece of information which may be used by a person having ordinary skill in the art in order to achieve the object of the present invention.

Thereafter, the core node returns to step S830 and may send the original information to the edge node. At step S840, the core node may receive a compression information transmission request, including information about a delivery unit of the original information, from the edge node. An operation for the edge node to determine the delivery unit and to send the compression information transmission request including the information about the delivery unit complies with the method of FIG. 5B. That is, the edge node may measure the amount of accumulated data of the original information transmitted by the core node in real time, and may determine one ruleset to be information about a delivery unit of the original information again based on the changed amount of accumulated data. If the determined delivery unit is different from a previously determined delivery unit of information, an operation of changing the previous delivery unit to the re-determined delivery unit of information may be included. The edge node may send the determined one ruleset, that is, information about the delivery unit, to the core node.

At step S850, the core node may generate compression information based on the information about the delivery unit which has been received from the edge node, and may send the compression information to the edge node. A subsequent operation is the same as that described above. If the core node sends the same original information as that previously transmitted to the edge node again using such a method, it sends compression information based on the amount of data of the original information that is received in real time not uniformly generated compression information, thereby being capable of obtaining a data transmission efficiency improvement effect. That is, for example, when a TCP packet is to be transmitted, in the case of initial transmission, in order to prevent an increase of delay time in a TCP slow start section, the core node may generate compression information based on a ruleset having a relatively small chunk unit. Thereafter, if the number of transmission packets has been increased, it deviates from the slow start section as the amount of accumulated information increases. Accordingly, the core node may increase a compression ratio in generating compression information by increasing the size of the chunk unit, thereby being capable of properly improving information transmission efficiency.

An embodiment has been divided into the embodiments of FIGS. 6A and 6B and the methods for the core node to send information have been shown in FIGS. 8A and 8B above. However, they correspond to embodiments for achieving the object of the present invention, and the methods of FIGS. 8A and 8B may be merged. That is, for example, the core node may first generate compression information based on a delivery unit of the original information received from the edge node, which has been determined based on the characteristics of the original information. That is, the core node may receive a compression information transmission request including information about a delivery unit which has been updated in real time from the edge node, may generate compression information based on the updated information about the delivery unit, and may send the generated compression information to the edge node. Furthermore, the aforementioned method may correspond to an embodiment for achieving the object of the present invention and may further include a method which may be applied by a person having ordinary skill in the art.

Figure 9:
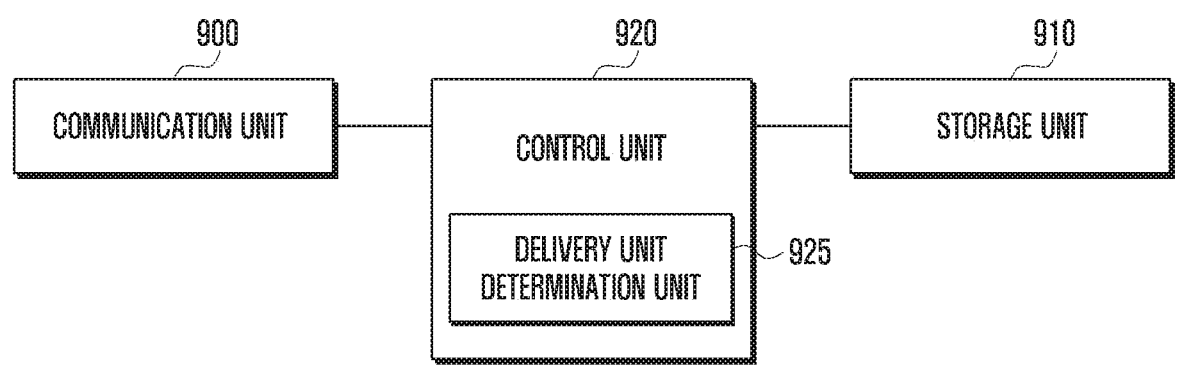
FIG. 9 is a block diagram showing the internal configuration of the edge node according to an embodiment of the present invention.

FIG. 9 is a block diagram showing the internal configuration of the edge node according to an embodiment of the present invention.

As shown in FIG. 9, the edge node 140 may include a communication unit 900, a storage unit 910 and a control unit 920. The control unit 920 may further include a delivery unit determination unit 925.

The communication unit 900 is connected to the core node 130 and the base station 120 of a wireless access network and may send and receive required information. The communication unit 900 may use the evolved packet core 110 and the switching device 115 in sending and receiving information to and from the core node 130 and the base station 120. The communication unit 900 may receive the original information from the core node 130. The communication unit 900 may send the received original information so that the original information is stored in the storage unit 910. The communication unit 900 may send a compression information transmission request, including information about a delivery unit of the original information determined based on the stored original information, to the core node 130. The communication unit 900 may receive compression information, generated based on the compression information transmission request, from the core node 130. The communication unit 900 may send the original information corresponding to the received compression information to the base station 120 of the wireless access network.

The storage unit 910 may store information necessary for an operation for the edge node 130 to receive information. The storage unit 910 may store the original information received from the core node 130. Furthermore, the storage unit 910 may store information about a delivery unit of the original information determined by the control unit 920, that is, a determined ruleset. The storage unit 910 may store compression information received from the core node 130. The storage unit 910 may send pieces of the stored information to the control unit 920 so that the control unit 920 may use the pieces of stored information to operate. Furthermore, the storage unit 910 may send the pieces of stored information to the communication unit 900 so that the pieces of stored information are transmitted to other devices of the present invention in a network, for example, the core node 130 and the base station 120.

The control unit 920 may control an operation performed by the edge node 130. More specifically, the control unit 920 may further include the delivery unit determination unit 925 which determines a delivery unit of the original information. The control unit 920 may control receiving first information from the transmission server, determining a delivery unit of the first information based on the received first information, sending a second information transmission request including information about the determined delivery unit to the transmission server, and receiving second information generated based on the delivery unit from the transmission server. Furthermore, the delivery unit determination unit 925 may control determining a delivery unit of the first information based on the received first information.

Furthermore, if the delivery unit of the first information is to be determined, the delivery unit determination unit 925 may determine the delivery unit of the first information based on the type of first information or may determine the delivery unit of the first information based on the amount of the first information received for a specific period. The type of first information may include the size of a minimum unit file that forms the first information. Furthermore, the delivery unit determination unit 925 may determine a plurality of pieces of information about the delivery unit. Furthermore, if a delivery unit is determined based on the amount of the first information received for the specific period, the delivery unit determination unit 925 may change the delivery unit according to predetermined criteria and determine the delivery unit.

Furthermore, if a delivery unit determined based on the amount of the received first information is changed, the control unit 920 may further control sending a second information transmission request, including information about the changed delivery unit, to the transmission server. When the second information transmission request is transmitted to the transmission server, if the delivery unit determination unit 925 has determined a plurality of delivery units, the control unit 920 may control sending two or more second information transmission requests corresponding to the plurality of delivery units, respectively. Furthermore, the control unit 920 may perform all of operations performed by the delivery unit determination unit 925.

Figure 10:
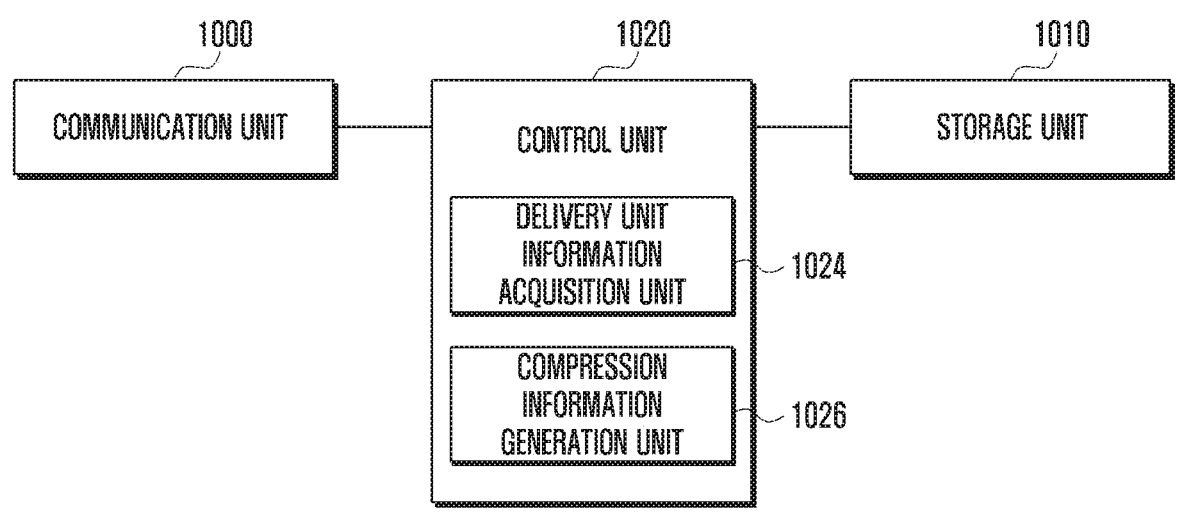
FIG. 10 is a block diagram showing the internal configuration of the core node according to an embodiment of the present invention.

FIG. 10 is a block diagram showing the internal configuration of the core node according to an embodiment of the present invention.

As shown in FIG. 10, the core node 130 may include a communication unit 1000, a storage unit 1010 and a control unit 1020. The control unit 1020 may further include a delivery unit information acquisition unit 1024 and a compression information generation unit 1026.

The communication unit 1000 is connected to the edge node 140 or the original server 105 and may send and receive required information. In sending and receiving information to and from the edge node 140 and the original server 105, the communication unit 1000 may use the Internet 100 or the evolved packet core 110. The communication unit 1000 may receive the original information, requested by the terminal 150 of a wireless access network, from the original server 105 and may send the received original information to the edge node 140. Furthermore, the communication unit 1000 may receive a compression information transmission request, including information about a delivery unit of the original information, from the edge node 140.

Furthermore, the communication unit 1000 may send the received compression information transmission request so that it is stored in the storage unit 1010. Furthermore, the communication unit 1000 may send the received compression information transmission request to the control unit 1020 so that the control unit 1020 uses the received compression information transmission request to operate. Furthermore, the communication unit 1000 may send compression information, received from the control unit 1020, to the edge node 140.

Furthermore, the storage unit 1010 may store the original information received from the original server 105. Furthermore, the storage unit 1010 may send the compression information transmission request, received from the communication unit 1000 and stored, to the control unit 1020 so that the control unit 1020 may use the compression information transmission request to generate compression information. Furthermore, the storage unit 1010 may store compression information generated by the control unit 1020. The storage unit 1010 may send the stored compression information to the communication unit 1000 so that the communication unit 1000 may send the stored compression information to the edge node 140.

The control unit 1020 may control sending first information to the reception server, receiving a second information transmission request including information about a determined delivery unit of the first information from the reception server, generating second information based on the information about the delivery unit, and sending the second information to the reception server. Furthermore, the delivery unit information acquisition unit 1024 included in the control unit 1020 may obtain information about a delivery unit by extracting it from the second information transmission request received from the reception server. Furthermore, if a second information transmission request including information about a changed delivery unit is received from the reception server, the delivery unit information acquisition unit 1024 may obtain the information about the changed delivery unit by extracting it from the second information transmission request. Furthermore, if the number of second information transmission requests is two or more, the delivery unit information acquisition unit 1024 may obtain pieces of information about two or more delivery units by extracting them from the two or more second information transmission requests, respectively.

Furthermore, the compression information generation unit 1026 included in the control unit 1020 may generate second information based on the information about the delivery unit that has been obtained by the delivery unit information acquisition unit 1024. The compression information generation unit 1026 may generate the second information by splitting and compressing the first information based on the information about the delivery unit. Furthermore, when a second information transmission request including information about a changed delivery unit is received from the reception server, the compression information generation unit 1026 may generate the second information based on the information about the changed delivery unit. Furthermore, the control unit 1020 may perform all of operations performed by the delivery unit information acquisition unit 1024 and the compression information generation unit 1026.

Meanwhile, although the preferred embodiments have been disclosed in this specification and drawings and specific terms have been used therein, they have been used in common meanings for easily describing the technological contents of the present invention and helping understanding of the present invention, but are not intended to limit the scope of the present disclosure. It will be evident to those skilled in the art that various implementations based on the technological spirit of the present invention are possible in addition to the disclosed embodiments.

The invention claimed is:

1. A method for a reception server to receive information in a content delivery network, the method comprising:
   receiving first information from a transmission server;
   determining a delivery unit of the first information based on a type of the first information or an amount of the first information received during a specific period:
   transmitting a compression information transmission request comprising information about the determined delivery unit to the transmission server; and
   receiving compression information for the first information, generated based on the information about the determined delivery unit from the transmission server, the compression information being generated by compressing the first information based on the information about the determined delivery unit,
   wherein the compression information transmission request is configured to request a transmission of the compression information, and
   wherein the compression information transmission request further comprises information about a changed delivery unit, in a case of the determining of the delivery unit changes the delivery unit.

2. The method of claim 1,
   wherein the type of the first information is determined based on a size of a minimum unit file forming the first information.

3. The method of claim 1,
   wherein the information about the determined delivery unit comprises information on a plurality of pieces of the first information, and
   wherein the method further comprises transmitting at least one third information transmission request to the transmission server corresponding to at least one piece of information of the plurality of pieces of information, respectively.

4. The method of claim 1,
   wherein the compression information is generated by splitting and compressing the first information based on the information about the determined delivery unit, and
   wherein the determined delivery unit is a chunk.

5. A method for a transmission server to transmit information in a content delivery network, the method comprising:
   transmitting first information to a reception server;
   receiving a compression information transmission request comprising information about a determined delivery unit of the first information from the reception server, the delivery unit determined based on a type of the first information or an amount of the first information received during a specific period;
   generating compression information for the first information based on the information about the determined delivery unit, the compression information being generated by compressing the first information based on the information about the determined delivery unit; and
   transmitting the compression information to the reception server,
   wherein the compression information transmission request is configured to request a transmission of the compression information, and
   wherein the generating of the compression information is further based on information about a changed delivery unit, in a case of the compression information transmission request received from the reception server including the information about the changed delivery unit.

6. The method of claim 5,
   wherein the type of the first information is determined based on a size of a minimum unit file forming the first information.

7. The method of claim 5,
   wherein the information about the determined delivery unit comprises information on a plurality of pieces of the first information, and
   wherein the method further comprises receiving at least one third information transmission request from the reception server corresponding to at least one piece of information of the plurality of pieces of information, respectively.

8. The method of claim 5,
   wherein the compression information is generated by splitting and compressing the first information based on the information about the determined delivery unit, and
   wherein the determined delivery unit is a chunk.

9. A reception server receiving information in a content delivery network, the reception server comprising:
   a transceiver configured to transmit and receive information to and from a transmission server; and
   a processor configured to control to:
     receive first information from the transmission server,
     determine a delivery unit of the first information based on a type of the first information or an amount of the first information received during a specific period,
     transmit a compression information transmission request comprising information about the determined delivery unit to the transmission server, and
     receive compression information for the first information, generated based on the information about the determined delivery unit from the transmission server, the compression information being generated by compressing the first information based on the information about the determined delivery unit,
   wherein the compression information transmission request is configured to request a transmission of the compression information, and
   wherein the compression information transmission request further comprises information about a changed delivery unit, in a case of the determining of the delivery unit changes the delivery unit.

10. The reception server of claim 9,
    wherein the type of the first information is determined based on a size of a minimum unit file forming the first information.

11. The reception server of claim 9,
    wherein the information about the determined delivery unit comprises information on a plurality of pieces of the first information, and
    wherein the processor is further configured to transmit at least one third information transmission request to the transmission server corresponding to at least one piece of information of the plurality of pieces of information, respectively.

12. The reception server of claim 9,
wherein the compression information is generated by splitting and compressing the first information based on the information about the determined delivery unit, and
wherein the determined delivery unit is a chunk.

13. A transmission server transmitting information in a content delivery network, the transmission server comprising;
a transceiver configured to transmit and receive information to and from a reception server; and
a processor configured to control to:
    transmit first information to the reception server,
    receive a compression information transmission request comprising information about a determined delivery unit of the first information from the reception server, the delivery unit determined based on a type of the first information or an amount of the first information received during a specific period,
    generate compression information for the first information based on the information about the determined delivery unit, the compression information being generated by compressing the first information based on the information about the determined delivery unit, and
    transmit the compression information to the reception server,
wherein the compression information transmission request is configured to request a transmission of the compression information, and
wherein the generating of the compression information is further based on information about a changed delivery unit, in a case of the compression information transmission request received from the reception server including the information about the changed delivery unit.

14. The transmission server of claim 13,
wherein the type of the first information is determined based on a size of a minimum unit file forming the first information.

15. The transmission server of claim 13,
wherein the information about the determined delivery unit comprises information on a plurality of pieces of the first information, and
wherein the processor is further configured to control to receive the at least one third information transmission request from the reception server corresponding to at least one piece of information of the plurality of pieces of information, respectively.

16. The transmission server of claim 13,
wherein the compression information is generated by splitting and compressing the first information based on the information about the determined delivery unit, and
wherein the determined delivery unit is a chunk.

* * * * *